(12) United States Patent
Chiu

(10) Patent No.: US 9,806,242 B2
(45) Date of Patent: Oct. 31, 2017

(54) OPTICAL LENS FOR LIGHT EMITTING DIODE DEVICE

(71) Applicant: HON HAI PRECISION INDUSTRY CO., LTD., New Taipei (TW)

(72) Inventor: Po-Chin Chiu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 160 days.

(21) Appl. No.: 14/862,391

(22) Filed: Sep. 23, 2015

(65) Prior Publication Data

US 2017/0084802 A1 Mar. 23, 2017

(51) Int. Cl.
| F21V 7/04 | (2006.01) |
|---|---|
| F21V 5/04 | (2006.01) |
| H01L 33/58 | (2010.01) |
| F21V 7/00 | (2006.01) |
| F21Y 115/10 | (2016.01) |

(52) U.S. Cl.
CPC ............ *H01L 33/58* (2013.01); *F21V 5/046* (2013.01); *F21V 7/0091* (2013.01); *F21Y 2115/10* (2016.08)

(58) Field of Classification Search
CPC ............ F21V 5/04; F21V 5/046; F21V 5/048
USPC ......... 362/97.1–97.3, 296.02, 296.07–296.1, 362/308–310, 311.01, 311.04, 311.06, 362/311.09–311.11; 359/642
See application file for complete search history.

(56) References Cited

U.S. PATENT DOCUMENTS

| 6,607,286 B2* | 8/2003 | West | F21V 5/04 |
| | | | 257/E33.072 |
| 7,142,769 B2* | 11/2006 | Hsieh | F21V 7/0091 |
| | | | 257/79 |
| 2015/0009680 A1* | 1/2015 | Chang | G02B 19/0028 |
| | | | 362/308 |

OTHER PUBLICATIONS

Linke, B., Understanding Flip-Chip and Chip-Scale Package Technologies and Their Applications, Jul. 3, 2014, Web Page.*

* cited by examiner

*Primary Examiner* — Andrew Coughlin
*Assistant Examiner* — Keith Delahoussaye
(74) *Attorney, Agent, or Firm* — Steven Reiss

(57) ABSTRACT

An optical lens for an LED includes an upper portion defining a light extraction face, a lower portion and an annular flange between the upper and lower portions. The lower portion has a wall section defining a cavity for receiving the LED therein, and a curved lateral side. A lateral light generated by the LED and running against the curved lateral side has at least a part being refracted or reflected thereby to run through the light extraction face of the optical lens.

16 Claims, 5 Drawing Sheets

OPTICAL LENS FOR LIGHT EMITTING DIODE DEVICE

FIELD

The subject matter herein generally relates to an optical lens, and particularly to an optical lens for a light emitting diode (LED) device to enhance light utilization of the LED device.

BACKGROUND

LED devices are more and more popularly used as light sources for different applications, such as backlight modules for liquid crystal displays (LCDs) or a variety of kinds of lamps. Following the evolution of packaging technology of LED chips from chip on board (COB) packaging to flip chip packaging and chip scale package (CSP) packaging, illumination angle of the LED chip is increased from top illumination for COB packaging to top and side illumination for flip chip packaging and CSP packaging.

Generally an optical lens is located over an LED chip to adjust a light filed generated by the LED chip to a required one. A bottom part of the side illumination generated by the LED chip of flip chip packaging or CSP packaging passes through a lateral side of the optical lens and propagates completely laterally, which does not contribute any usefulness for the desired illumination. The desired illumination needs the light to propagate at least partly forwardly.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
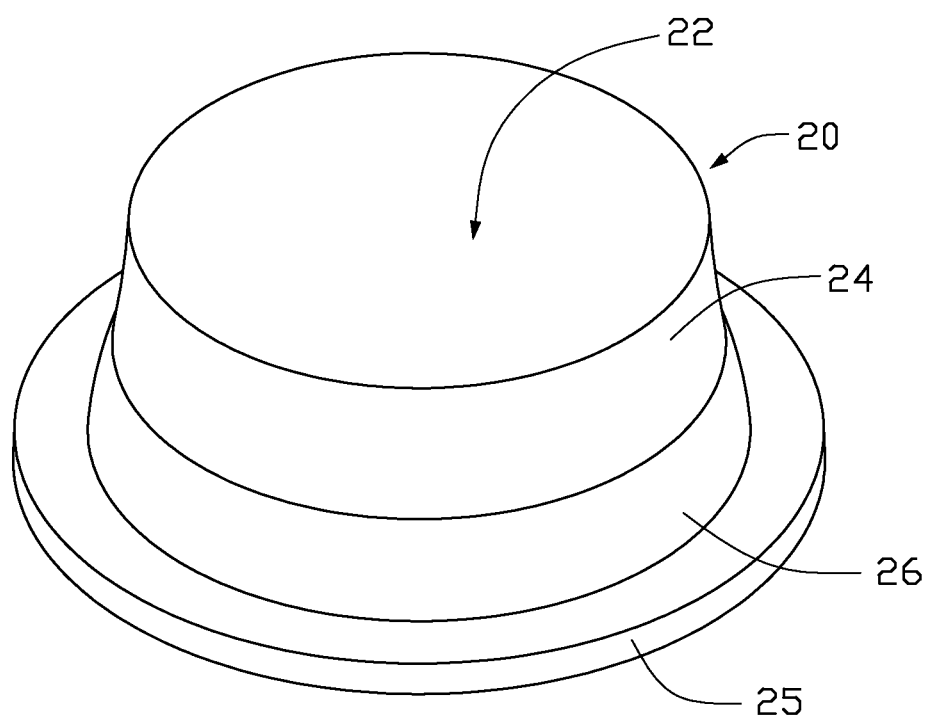
FIG. 1 is an isometric view of an optical lens in accordance with a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 illustrates an optical lens 10 in accordance with a first embodiment of the present disclosure. The optical lens 10 can be formed by plastic injection molding of transparent resin such as polymethylmethacrylat (PMMA). The optical lens 10 includes an upper portion 20 and a substantially annular flange 25 extending outwardly from a bottom of the upper portion 20. The annular flange 25 has a diameter larger than a diameter of the upper portion 20. The upper portion 20 defines a central depression 22 having a shape similar to an inverted cone. The upper portion 20 further forms a first wall section 24 around the central depression 22 and a second wall section 26 between the first wall section 24 and the annular flange 25. When plastic injection forming the optical lens 10, the resin enters a mold cavity for forming the optical lens 10 from an inlet located coincidental to a lateral side of the annular flange 25 which is a non-optical part of the optical lens 10. Thus, the optical performance of the optical lens 10 according to the present disclosure will not be adversely affected by the inlet of the mold cavity, where is a place that usually will mostly affect an optical performance of an optical lens after the optical lens is formed.

Figure 2:
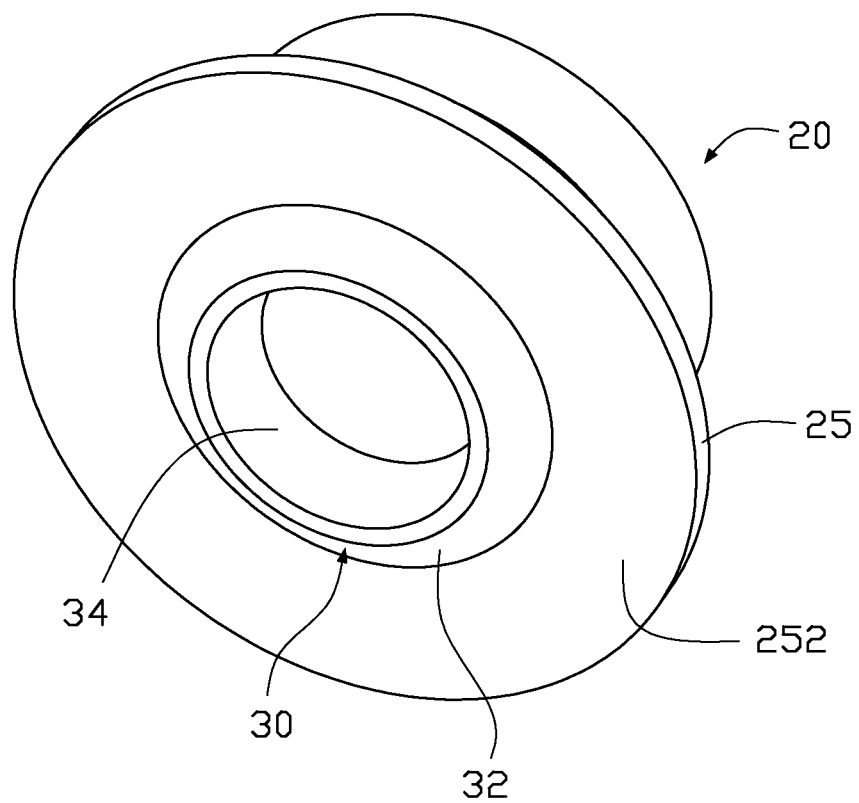
FIG. 2 is an isometric view of the optical lens of FIG. 1, viewed from another angle.

FIG. 2 illustrates the optical lens 10 further has a lower portion 30 below the annular flange 25. The diameter of the annular flange 25 is larger than a diameter of the lower portion 30. The lower portion 30 has a third wall section 32 extending downwardly from a central portion of a bottom 252 of the annular flange 25. The third wall section 32 is hollow and defines a central cavity 34 therein. The central cavity 34 extends upwardly toward the central depression 22.

Figure 3:
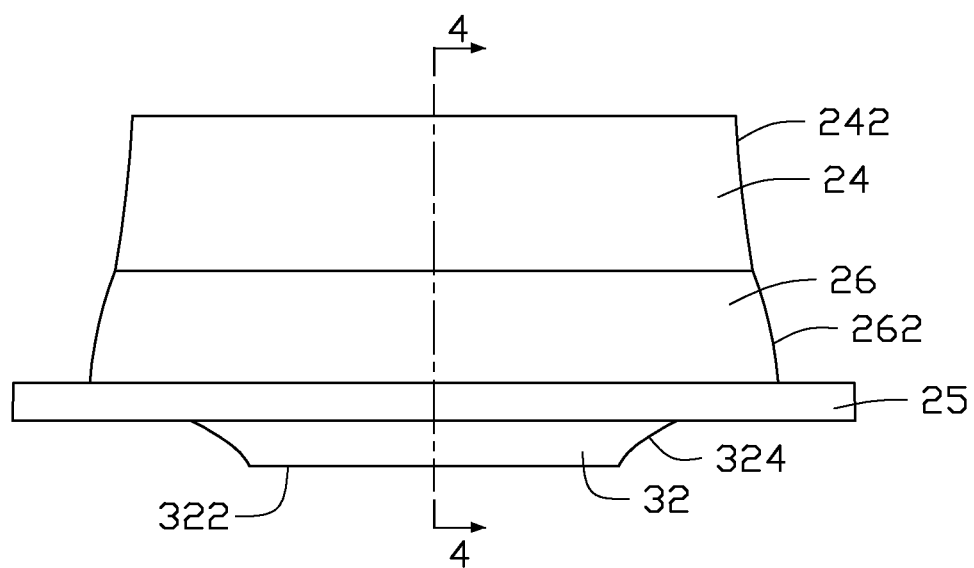
FIG. 3 is a front elevational view of the optical lens of FIG. 1.

FIG. 3 illustrates the third wall section 32 has a bottom 322 and a lateral side 324. The bottom 322 is flat, while the lateral side 324 is curved inwardly toward a central of the optical lens 10. The lateral side 324 can be a curve having a curvature varied along its length. For example, the curvature is gradually decreased along a bottom-to-top direction. Alternatively, the curvature can be a constant, whereby the curve forms an arc of a circle. The first wall section 24 has a lateral side 242 which forms a lateral side of a frusto-cone. The second wall section 26 has a lateral side 262 which is a curve curved away from the center of the optical lens 10. A curvature of the lateral side 262 can be varied along its length or be constant.

Figure 4:
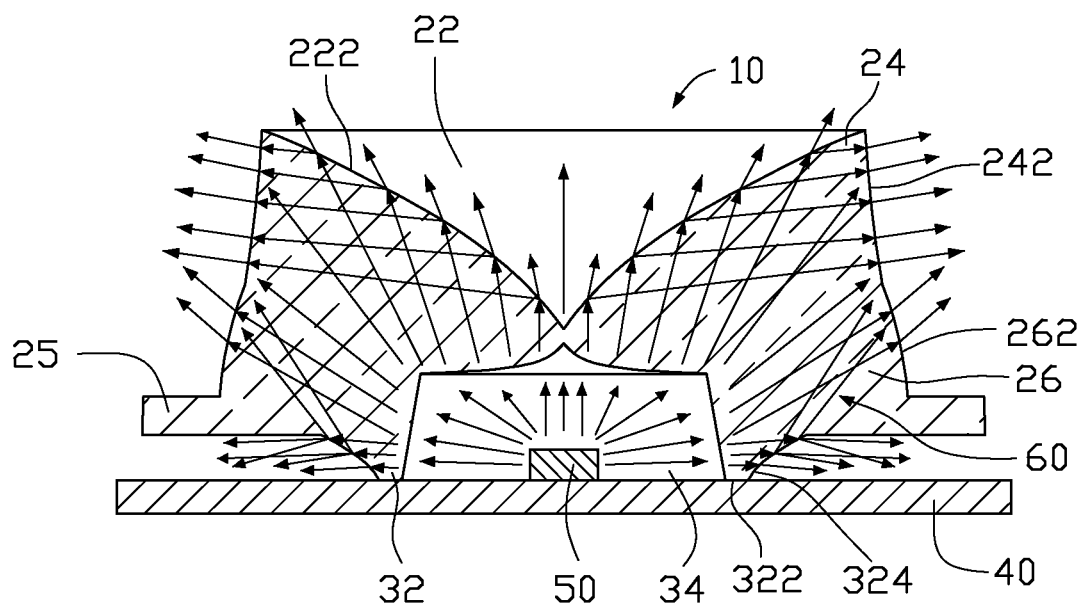
FIG. 4 is a cross-sectional view of FIG. 3, taken along line 4-4 thereof, with the optical lens being mounted to a substrate and receiving an LED therein.

FIG. 4 illustrates that the optical lens 10 and a LED chip 50 are mounted on a substrate 40 to form an LED device 1, wherein the LED chip 50 is received in the central cavity 34 of the optical lens 10. The substrate 40 can be a printed circuit board which can supply power to the LED chip 50 whereby the LED chip 50 can work to emit light. The LED chip 50 can emit light from a top and a lateral side thereof. The LED chip 50 can be a flip chip packaging LED chip or a CSP packaging LED chip. The optical lens 10 is mounted on the substrate 40 with the bottom 322 of the third wall section 32 engaging a top of the substrate 40. A center of the LED chip 50 is aligned with the center of the optical lens 10. A top 222 of the optical lens 10 defining the central depression 22 forms a first light extraction face for the LED device 1. The lateral sides 242, 262 of the first and second wall sections 24, 26 cooperatively form a second light extraction face for the LED device 1. FIG. 4 illustrates that most of the light generated by the LED chip 50 and entering the optical lens 10 along an upward direction can leave the optical lens 10 from the first and second light extraction faces to illuminate an object needing illumination. The light generated by the LED chip 50 and entering the optical lens 10 along a lateral direction runs against the lateral side 324 of the third wall section 32. According to the present disclosure, since the lateral side 324 is a curve, the light runs thereon has at least a part, as indicated by arrows 60, being refracted thereby to run to the lateral side 262 of the second wall section 26. From the lateral side 262, the part 60 of the light leaves the optical lens 10 to illuminate the object needing illumination. By such design, at least a part of the lateral light can be directed to the second light extraction face of the LED device 1, thereby to increase the utilization of the light generated by the LED chip 50.

Figure 5:
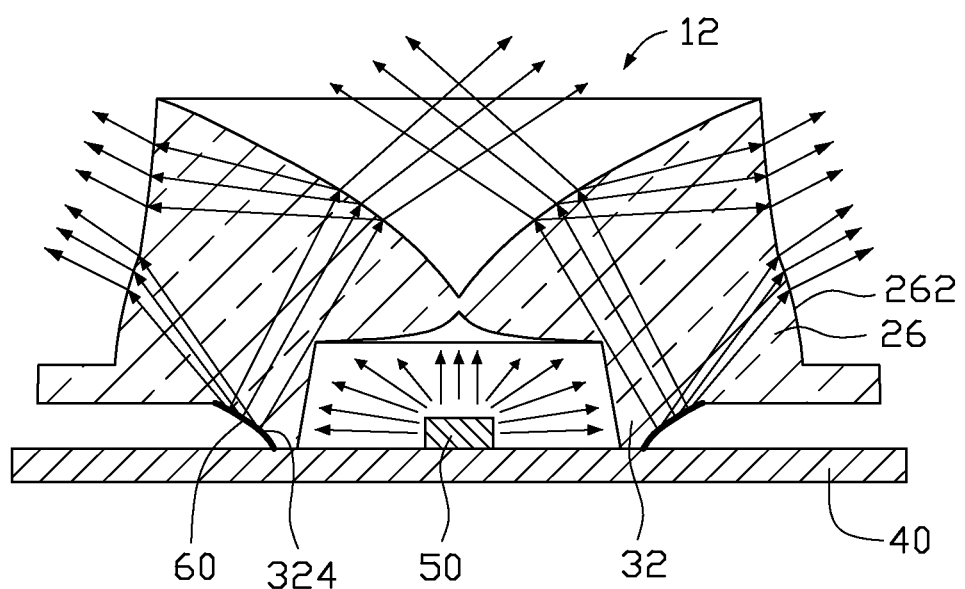
FIG. 5 is a view similar to FIG. 4, showing an optical lens in accordance with a second embodiment of the present disclosure.

FIG. 5 shows an optical lens 12 in accordance a second embodiment of the present disclosure, which is mounted on a substrate 40 to cover an LED 50 therein. The optical lens 12 is substantially the same as the optical lens 10 of the first embodiment. The only difference is that a reflective coating 60 is applied to the lateral side 324 of the third wall section 32, whereby lateral light generated by the LED chip 50 and running against the lateral side 324 can be totally reflected thereby to emit out of the LED device 1 through the first and second light extraction faces thereof. Thus, the utilization of the light generated by the LED chip 50 can be further enhanced. In a further alternative embodiment of the present disclosure, the lateral side 262 of the second wall section 26 can also be coated with a reflective coating to thereby increase the intensity of the light extracted from the LED device 1.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in particular the matters of shape, size and arrangement of parts within the principles of the present disclosure, up to and including the full extent established by the broad general meaning of the terms used in the claims.

What is claimed is:

1. An optical lens comprising:
an upper portion comprising a top face that defines a central depression recessed downwardly and a side face wherein the top face and a side face of the upper portion together constituting a light extraction face for the optical lens;
a lower portion comprising a bottom face and a lateral face, wherein the bottom face of the lower portion that defines a cavity recessed upwardly toward the central depression, the cavity being configured for receiving a light source therein; and
a flange between the upper portion and the lower portion;
wherein the lateral face of the lower portion being curved whereby at least a part of lateral light generated by the light source and running against the lateral face of the lower portion being at least one of refracted and reflected thereby to move to the light extraction face of the optical lens;
wherein the curved lateral face of the lower portion is curved toward a center of the optical lens; and
wherein a reflective coating is formed on the curved lateral face of the lower portion.

2. The optical lens of claim 1, wherein when forming the optical lens by plastic injection molding, resin flows to a cavity for forming the optical lens from a place thereof coincidental for forming the flange.

3. The optical lens of claim 1, wherein a curvature of the curved lateral face of the lower portion is varied along its length.

4. The optical lens of claim 3, wherein the curvature of the curved lateral face of the lower portion is gradually decreased along a bottom-to-top direction.

5. The optical lens of claim 1, wherein the upper portion includes a first wall section and a second wall section between the first wall section and the flange, the first wall section having a configuration of a frusto-cone, a lateral side of the second wall section being curved away from the center of the optical lens.

6. The optical lens of claim 5, wherein a reflective coating is formed on the lateral side of the second wall section of the upper portion.

7. A light emitting diode (LED) device comprising:
an LED chip for generating light from a top and a lateral side of the LED chip; and
an optical lens covering the LED chip therein, the optical lens comprising:
an upper portion;
a lower portion; and
a flange between the upper portion and the lower portion;
wherein a top face of the upper portion defines a central depression recessed downwardly, the top face and a side face of the upper portion together constituting a light extraction face for the LED device; and
wherein a bottom face of the lower portion of the optical lens defines a cavity recessed upwardly toward the central depression, the cavity receiving the LED chip therein, a lateral face of the lower portion being curved whereby at least a part of the lateral light generated by the LED chip and running against the lateral face of the lower portion is at least one of refracted and reflected thereby to move to the light extraction face of the LED device;
wherein the curved lateral face of the lower portion of the optical lens is curved toward a center of the optical lens; and
wherein a reflective coating is formed on the curved lateral face of the lower portion of the optical lens.

8. The LED device of claim 7, wherein when forming the optical lens by plastic injection molding, resin flows to a cavity for forming the optical lens from a place thereof coincidental for forming the flange.

9. The LED device of claim 7, wherein the LED chip is selected from one of a group consisting of a flip chip packaging LED chip and a chip scale package (CSP) packaging LED chip.

10. The LED device of claim 7, wherein the LED chip and the optical lens are mounted on a substrate with the bottom of the lower portion of the optical lens engaging a top of the substrate.

11. The LED device of claim 7, wherein a curvature of the curved lateral face of the lower portion is varied along its length.

12. The LED device of claim 11, wherein the curvature of the curved lateral face of the lower portion is gradually decreased along a bottom-to-top direction.

13. The LED device of claim 7, wherein the upper portion of the optical lens includes a first wall section and a second wall section between the first wall section and the flange, the first wall section having a configuration of a frusto-cone, a lateral side of the second wall section being curved away from the center of the optical lens.

14. The LED device of claim 13, wherein a reflective coating is formed on the lateral side of the second wall section of the upper portion of the optical lens.

15. A light emitting diode (LED) device comprising:
a substrate;
an LED chip for generating light from a top and a lateral side of the LED chip, the LED chip being mounted on the substrate;
an optical lens mounted on the substrate and covering the LED chip therein, the optical lens comprising:
  an upper portion defining a light extraction face for the LED device;
  a lower portion; and
  a flange between the upper portion and the lower portion, the flange having a diameter larger than a diameter of each of the upper portion and the lower portion;
wherein a bottom face of the lower portion of the optical lens engages with the substrate and defines a cavity recessed upwardly, the cavity receiving the LED chip therein, a lateral face of the lower portion being curved inwardly whereby at least a part of the lateral light generated by the LED chip and running against the lateral face of the lower portion is modulated thereby to move to the light extraction face of the LED device; and
wherein a reflective coating is formed on the curved lateral face of the lower portion of the optical lens.

16. The LED device of claim 15, wherein the modulation of the at least a part of the lateral light by the lateral face of the lower portion of the optical lens includes at least one of reflection and refraction.

* * * * *